United States Patent
Chen et al.

(10) Patent No.: US 10,411,697 B1
(45) Date of Patent: Sep. 10, 2019

(54) VOLTAGE DETECTION CIRCUIT

(71) Applicant: NUVOTON TECHNOLOGY CORPORATION, East Dist., Hsinchu (TW)

(72) Inventors: Po-Sheng Chen, Hsinchu (TW); Yeh-Tai Hung, Hsinchu (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 0 days.

(21) Appl. No.: 16/125,111

(22) Filed: Sep. 7, 2018

(30) Foreign Application Priority Data

Apr. 24, 2018 (TW) .............................. 107113879 A

(51) Int. Cl.
| | |
|---|---|
| *H03K 17/687* | (2006.01) |
| *G01R 19/165* | (2006.01) |
| *G01R 31/02* | (2006.01) |
| *H03K 19/094* | (2006.01) |
| *H03K 19/003* | (2006.01) |
| *H03K 17/16* | (2006.01) |

(52) U.S. Cl.
CPC ..... *H03K 17/687* (2013.01); *G01R 19/16538* (2013.01); *G01R 19/16566* (2013.01); *G01R 31/025* (2013.01); *H03K 17/162* (2013.01); *H03K 19/00384* (2013.01); *H03K 19/094* (2013.01)

(58) Field of Classification Search
None
See application file for complete search history.

(56) References Cited

U.S. PATENT DOCUMENTS 6,445,305 B2 * 9/2002 Andersson ....... G01R 19/16542
340/635

* cited by examiner

*Primary Examiner* — Jeffery S Zweizig
(74) *Attorney, Agent, or Firm* — Muncy, Geissler, Olds & Lowe, P.C.

(57) ABSTRACT

A voltage detection circuit is disclosed. The voltage detection circuit includes a threshold voltage detection circuit, a current leakage compensation circuit and a low voltage detection circuit. The threshold voltage detection circuit detects the voltage of a power source and determines whether the voltage is dropped over a threshold voltage, so as to wake up the low voltage detection circuit. The current leakage compensation circuit determines whether a voltage difference between the first voltage and the second voltage exceeds a preset value, so as to generate a trigger signal to activate the low voltage detection circuit. As a result, the voltage detection circuit can have high efficiency and low power consumption, and can detect the voltage drop more accurately in environment with current leakage, temperature variation, or process variation.

10 Claims, 5 Drawing Sheets

VOLTAGE DETECTION CIRCUIT

CROSS-REFERENCE TO RELATED APPLICATION

This application claims the benefit of Taiwan Patent Application No. 107113879, filed on Apr. 24, 2018, in the Taiwan Intellectual Property Office, the disclosure of which is incorporated herein in its entirety by reference.

BACKGROUND OF THE INVENTION

1. Field of the Invention

The present invention relates to a voltage detection circuit with low power consumption. More particularly, the present invention relates to a voltage detection circuit which uses a current leakage compensation circuit to detect current leakage condition of the electronic system, so as to drive the low-voltage detection circuit to ensure the operation voltage of the electronic system.

2. Description of the Related Art

In recent years, the voltage detection method usually uses a low-threshold-voltage transistor to sample voltage of a power source based on a sampling cycle which is controlled by the clock signal, so that a voltage across a storage capacitor can be maintained at a voltage level of the power source. When it is detected that a voltage drop of the power source exceeds a predetermined range, it is determined that an operation voltage of the electronic system is changed, and a subsequent control program is then triggered. Such voltage detection is a critical and necessary function for microprocessor, microcontroller, and the so on. However, a slow voltage change caused by weak current leakage of the capacitor cannot be detected by the conventional voltage detection method; in other words, the conventional voltage detection circuit is hard to accurately detect a voltage drop caused by current leakage, or temperature variation, or process variation.

Furthermore, in the conventional voltage detection method, a reference voltage is usually used as a reference to determine whether the voltage of the power source is changed, or a voltage divider circuit is used to detect the voltage change of the power source within a specific voltage range. However, the conventional voltage detection circuit must be kept in an active state for detection for a long time, but it also increases the power consumption of the detection circuit. In order to reduce non-necessary power consumption, the comparator circuit may be periodically, based on the clock signal, turn on for sampling, but an oscillator for generating clock signal still consumes power. As a result, this manner cannot significantly reduce the power consumption of the conventional voltage detection circuit.

Therefore, the conventional voltage detection circuit still has considerable defects in use. What is needed is to develop a voltage detection circuit that is not affected by current leakage, temperature variation, or process variation, to solve the conventional problems.

SUMMARY OF THE INVENTION

In view of the aforementioned technical problems, an objective of the present invention is to provide a voltage detection circuit having a current leakage compensation circuit, to solve the problem that the conventional voltage detection circuit fails to accurately detect the change in operation voltage caused by current leakage, temperature variation or process variation.

In an embodiment, the present invention provides a voltage detection circuit which is electrically connected to a power source and comprises a threshold voltage detection circuit, a current leakage compensation circuit and a low-voltage detection circuit. Threshold voltage detection circuit comprises a first switch, a first capacitor, a second switch and a second capacitor. A drain of the first switch is electrically connected to the power source, a gate of the first switch receives a clock signal and trigger, according to the clock signal, the first switch to turn on in sampling cycle. The first capacitor is disposed between the first switch and a first ground terminal, and can be charged to the first voltage. A source of the second switch is electrically connected between the source of the first switch and the first capacitor, and a gate of the second switch is electrically connected to the power source. When the voltage of the power source received by the second switch is lower than the first voltage by a threshold voltage, the second switch is turned on to transmit a first trigger signal. The second capacitor is disposed between the second switch and a second ground terminal. A current leakage rate of the current leakage compensation circuit is higher than a current leakage rate of the threshold voltage detection circuit. The current leakage compensation circuit comprises a third switch, a third capacitor and a first comparator. A source of the third switch is electrically connected to the power source, and a gate of the third switch receives the clock signal to trigger, according to the clock signal, the third switch to turn on in the sampling cycle. The third capacitor is disposed between the third switch and a third ground terminal, and can be charged to a second voltage. The first comparator comprises a first input terminal electrically connected between a source of the first switch and the first capacitor, and a second input terminal electrically connected between the drain of the third switch and the third capacitor. When a difference between the first voltage inputted from the first input terminal and the second voltage inputted from the second input terminal exceeds a preset value, the first comparator outputs the clock signal and the second trigger signal. The low-voltage detection circuit is electrically connected to the threshold voltage detection circuit and the current leakage compensation circuit, and configured to receive the first trigger signal or the second trigger signal to detect whether the voltage of the power source is lower than a reference voltage.

Preferably, a capacitance of the first capacitor is higher than a capacitance of the third capacitor.

Preferably, a ratio of capacitances of the first capacitor to the third capacitor is 10:1.

Preferably, a transistor size of the first switch is lower than a transistor size of the third switch.

Preferably, a ratio of transistor sizes of the first switch to the third switch is 1:10.

Preferably, the current leakage compensation circuit can comprise a current leakage path formed between the third switch and third capacitor.

Preferably, the current leakage compensation circuit comprises a fourth switch disposed between the third switch and the third capacitor.

Preferably, the low-voltage detection circuit can comprise a voltage divider and a second comparator, and the voltage divider is electrically connected to the power source, and the second comparator is activated by the first trigger signal or the second trigger signal, and configured to compare an input voltage of the power source inputted from the voltage divider and a reference voltage, and when the input voltage is lower than the reference voltage, the second comparator generates a reset signal.

Preferably, a current leakage rate of the first capacitor through the first switch can be lower than a current leakage rate of the third capacitor through the third switch.

Preferably, the threshold voltage detection circuit comprises a reset switch connected to the second capacitor in parallel.

According to above contents, the voltage detection circuit of the present invention can at least one of the following advantages.

First, the voltage detection circuit can use the threshold voltage detection circuit to sample the voltage of the power source, to ensure that the voltage detection circuit is able to detect whether the voltage drop of the power source exceeds a predetermined range, so as to prevent the components from being damaged by excessive change in the operation voltage.

Secondly, in the voltage detection circuit, the current leakage compensation circuit can simulate the structure of the threshold voltage detection circuit, and further amplify the current leakage of the threshold voltage detection circuit for detection of voltage drop caused by current leakage, temperature variation or process variation, so as to improve the accuracy of voltage detection.

Thirdly, in the voltage detection circuit, when detecting that the voltage drop of the power source exceeds the preset value, the current leakage compensation circuit generates the clock signal, instead of the clock signal with fixed sampling cycle; furthermore, the low-voltage detection circuit can be woken up by the trigger signal generated by the threshold voltage detection circuit or the current leakage compensation circuit, to greatly reduce the power consumption pf entire circuit and improve efficiency of the voltage detection circuit.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
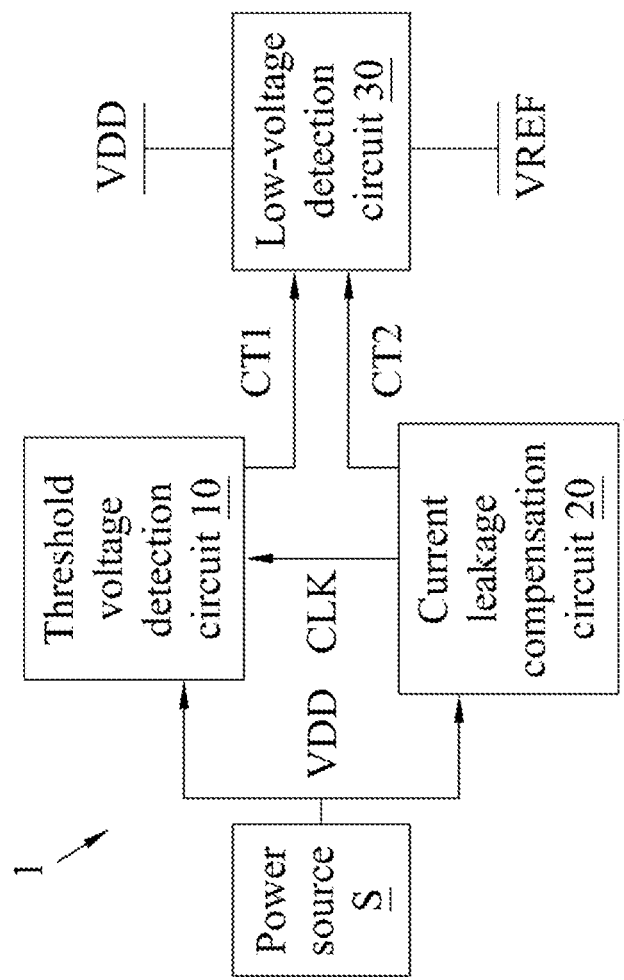
FIG. 1 is a block diagram of a voltage detection circuit of an embodiment of the present invention.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Please refer to FIG. 1, which is a block diagram of a voltage detection circuit of an embodiment of the present invention. A voltage detection circuit 1 comprises a threshold voltage detection circuit 10, a current leakage compensation circuit 20 and a low-voltage detection circuit 30. The voltage detection circuit 1 is configured to detect an operation voltage provided by the power source S to the electronic device. The power source S is electrically connected to the threshold voltage detection circuit 10 and the current leakage compensation circuit 20. The threshold voltage detection circuit 10 is configured to detect, every sampling cycle, whether a voltage drop of the voltage VDD provided by the power source S exceeds a preset threshold voltage, and if yes, the threshold voltage detection circuit 10 transmits a first trigger signal CT1 to the low-voltage detection circuit 30. Upon receipt of the first trigger signal CT1, the low-voltage detection circuit 30 samples the voltage VDD and compares the sampled voltage with a preset reference voltage VREF, so as to ensure a stable operation voltage for the electronic device, and prevent the components from being damaged by excessive voltage change of the operation voltage. In this embodiment, the low-voltage detection circuit 30 is at an OFF state in default, so as to reduce the power consumption of the low-voltage detection circuit, that is, the low-voltage detection circuit 30 is not waken up to sample the voltage for comparison with the reference voltage VREF until the low-voltage detection circuit 30 receives the trigger signal.

The threshold voltage detection circuit 10 is configured to detect a fast voltage drop, and when the voltage VDD of the power source S falls quickly, the threshold voltage detection circuit 10 can activate the low-voltage detection circuit 30 for perform detection and sequential reset operation or power off operation. However, the threshold voltage detection circuit 10 is unable to monitor the slow voltage drop caused by small current leakage, so the current leakage compensation circuit 20 is disposed to solve the slow voltage drop problem caused by current leakage. In this embodiment, the current leakage compensation circuit 20 is electrically connected to the power source S and configured to receive the voltage VDD of the power source S. Particularly, the current leakage phenomenon is amplified by specific circuit components of the current leakage compensation circuit 20, that is, when current leakage occurs and causes a voltage change higher than a preset value, the current leakage compensation circuit 20 transmits a second trigger signal CT2 to activate the low-voltage detection circuit 30 for detecting the difference between the voltage VDD and the reference voltage VREF. Furthermore, when the current leakage occurs and cause the voltage change higher than the preset value, the current leakage compensation circuit 20 also transmits the clock signal CLK to the threshold voltage detection circuit 10, to trigger the threshold voltage detection circuit 10 to refresh and sample the voltage. Abovementioned clock signal CLK operation manner can be implemented with fewer oscillators or without oscillator, so that the electronic device with the voltage detection circuit of the present invention can be more power-saving. Furthermore, instead of using the clock signal with fixed frequency generated by the oscillator to refresh the voltage stored in the capacitor, the voltage detection circuit 1 of this embodiment can adjust the refresh time according to different environmental temperature condition, so that the voltage detection circuit 1 can be operated more accurately and more efficiently. The following describes the details of the voltage detection circuit 1.

Figure 2:
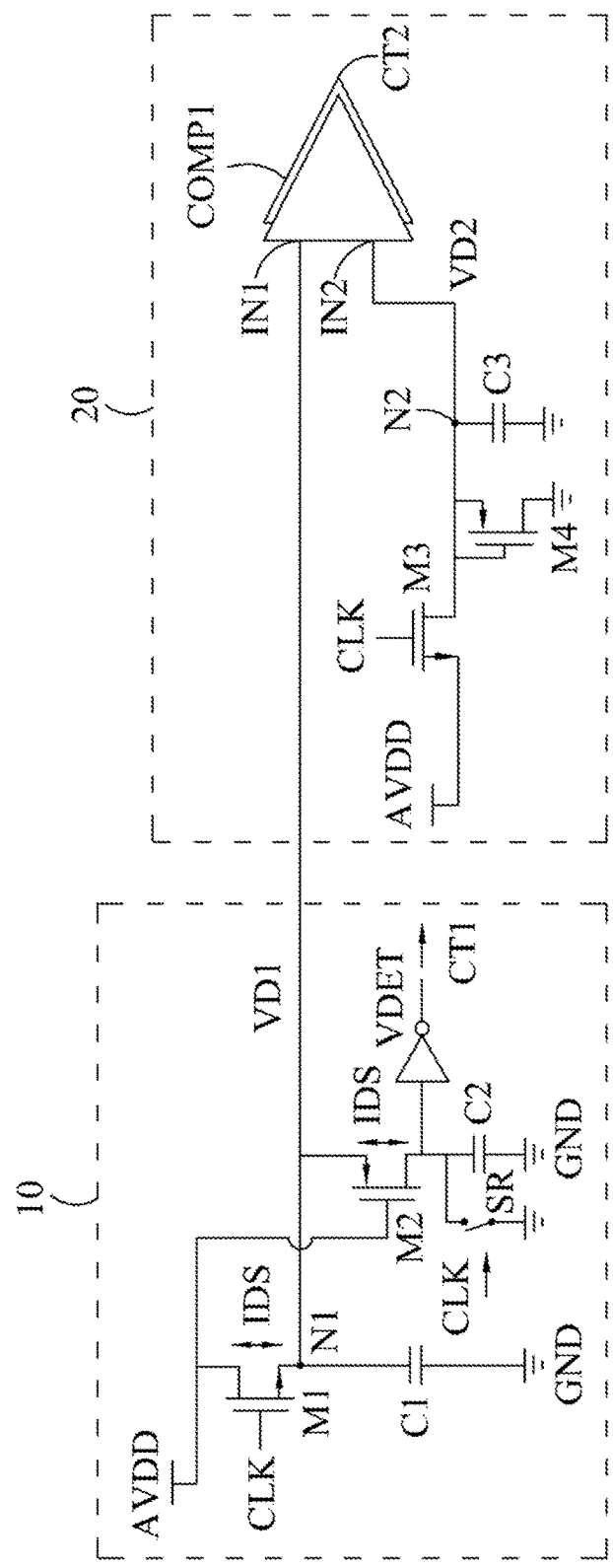
FIG. 2 is a circuit diagram of a threshold voltage detection circuit and a current leakage compensation circuit of an embodiment of the present invention.

Please refer to FIG. 2, which is a circuit diagram of a threshold voltage detection circuit and a current leakage compensation circuit of an embodiment of the present invention. As shown in FIG. 2, the threshold voltage detection circuit 10 comprises a first switch M1, a second switch M2, a first capacitor C1, an invertor VDET and a reset switch SR. A drain of the first switch M1 is electrically connected to the power source and configured to receive an operation voltage AVDD of a power source, a gate of the first switch M1 is configured to receive to a clock signal CLK, the source of the first switch M1 is electrically connected to a first node Ni. The first capacitor C1 is disposed between the first switch M1 and the first ground terminal GND, that is, a terminal of the first capacitor C1 is electrically connected to the source of the first switch M1 through first node Ni. When the clock signal CLK triggers the first switch M1 to turn on at the sampling cycle, the first capacitor C1 is refreshed to charge, and the voltage of the first capacitor C1 is maintained on a first voltage VD1. A gate of the second switch M2 is electrically connected to the power source and configured to receive the operation voltage AVDD of the power source, a source of the second switch M2 is electrically connected to the first node N1 and configured to receive the first voltage VD1 from the source of first switch M1. The second capacitor C2 is disposed between the second switch M2 and a second ground terminal GND. When the operation voltage AVDD received from the gate of the second switch M2 is lower than the first voltage VD1 of the first node N1 by a threshold voltage of the second switch M2, the second switch M2 is turned on to output the first trigger signal CT1 through the invertor VDET, so as to wake up the low-voltage detection circuit 30.

In more detail, a high voltage part of the clock signal CLK is higher than the operation voltage AVDD by a threshold voltage of the first switch M1, and the threshold voltage detection circuit 10 detects that a voltage drop in the operation voltage AVDD exceeds the threshold voltage of the second switch M2 during the sampling cycle corresponding to the clock signal CLK, the low-voltage detection circuit 30 is woken up. The detection result of the threshold voltage detection circuit 10 is mainly based on the voltage of the other terminal of the second capacitor C2 other than the second ground terminal GND. When the terminal voltage of the second capacitor C2 is at high voltage level, it indicates the occurrence of the voltage drop, so the first trigger signal CT1 is outputted. In an embodiment, a reset switch SR can be disposed between the second switch M2 and the second capacitor C2, and electrically connected to the second capacitor C2 in parallel and controlled by a clock signal CLK for reset. The reset switch SR can be used to maintain the terminal voltage of the second capacitor C2 at ground voltage periodically, so as to prevent false action of the second switch M2 due to the increasing of the terminal voltage of the second capacitor C2 caused by current leakage.

In this embodiment, the first switch M1 can be a NMOS transistor and the second switch M2 can be a PMOS transistor. Preferably, the first switch M1 can be a native NMOS transistor or a zero threshold voltage NMOS field-effect transistor.

In the threshold voltage detection circuit 10, when the first switch M1 is turned off, the voltage on the first node N1 should be maintained at the first voltage VD1 ideally; however, in actual implementation, current leakage may occur through the current path IDS shown in FIG. 2 to cause slow voltage drop, and the threshold voltage detection circuit 10 is hard to detect the slow and small voltage drop. For this reason, the voltage detection circuit of this embodiment includes the current leakage compensation circuit 20 to solve this problem. The current leakage compensation circuit 20 has a structure similar to the structure of the threshold voltage detection circuit, that is, the current leakage compensation circuit 20 also as current leakage when the switch is turned off, so that tiny current is discharged from the capacitor to cause voltage drop. The current leakage compensation circuit 20 has a current leakage rate higher than a current leakage rate of the threshold voltage detection circuit 10, that is, the current leakage compensation circuit 20 is designed to amplify the voltage drop caused by the current leakage, so as to more effectively monitor the small voltage drop caused by current leakage.

As shown in FIG. 2, the current leakage compensation circuit 20 comprises a third switch M3, a fourth switch M4, a third capacitor C3 and a first comparator COMP'. The source of the third switch M3 is connected to the power source and configured to receive the operation voltage AVDD of the power source, the gate of the third switch M3 is configured to receive to the clock signal CLK, and the drain of the third switch M3 is electrically connected to the second node N2. The third capacitor C3 is disposed between the third switch M3 and third ground terminal GND, that is, a terminal of the third capacitor C3 is electrically connected to the drain of the third switch M3 through the second node N2. When the clock signal CLK triggers the third switch M3 to turn on at the sampling cycle, the third capacitor C3 is refreshed to charge, so that the voltage of the third capacitor C3 can be maintained at the second voltage VD2. The fourth switch M4 is disposed between the drain of the third switch M3 and the second node N2, and includes a terminal electrically connected to the third switch M3 and other terminal grounded. In this embodiment, the third switch M3 can be a NMOS transistor and the fourth switch M4 can be a PMOS transistor.

In this embodiment, the capacitance of the first capacitor C1 is higher than the capacitance of the third capacitor C3, for example, the capacitance of the first capacitor C1 can be 5 times to 15 times of that of the third capacitor C3; and, preferably, a ratio of capacitances of the first capacitor C1 to the third capacitor C3 can be 10:1. Compared with the first capacitor C1, the third capacitor C3 has the lower capacitance, so when the same current leakages occur on the first capacitor C1 and the third capacitor C3, the change in the second voltage VD2 on second node N2 is higher. The first input terminal IN1 of the first comparator COMP1 is electrically connected between the first input terminal IN1 of the first switch M1 and the first capacitor C1, and also connected to the first node N1; and, the second input terminal IN2 is electrically connected between the drain of the third switch M3 and the third capacitor C3, and also electrically connected to the second node N2. When a difference between the first voltage VD1 inputted from the first input terminal IN1 and the second voltage VD2 inputted from the second input terminal IN2 exceeds a preset voltage value, it can be determined that current leakage occurs, so the first comparator COMP1 outputs the second trigger signal CT2 to wake up the low-voltage detection circuit 30.

Figure 3:
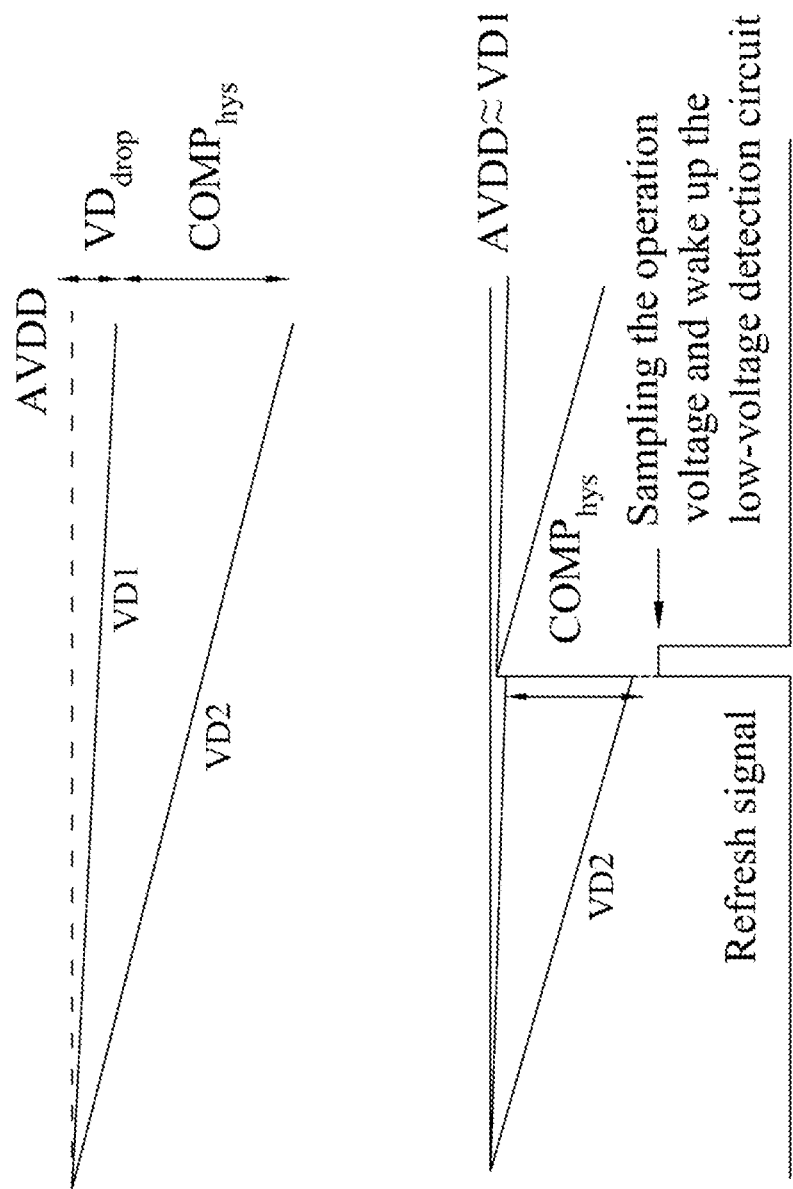
FIG. 3 is a schematic view of operation of current leakage compensation circuit of an embodiment of the present invention.

Please refer to FIG. 3, which is a schematic view of comparison of the voltage of current leakage compensation circuit of an embodiment of the present invention. Ideally, the operation voltage AVDD can be maintained at voltage stably, but in actual application, the first voltage VD1 on the first node N1 in the threshold voltage detection circuit 10 may have small voltage drop $VD_{drop}$ because of current leaked through the current path IDS. As shown in FIG. 3, the amplitude of voltage drop $VD_{drop}$ may be so small that the first voltage VD1 is almost equal to the operation voltage AVDD; for this reason, the threshold voltage detection circuit 10 is hard to detect such small change in voltage. However, in the current leakage compensation circuit 20, the second voltage VD2 of second node N2 may have more significant voltage drop in the same current leakage condition because of higher current leakage rate, so the difference between the first voltage VD1 and the second voltage VD2 can be detected. For example, when the difference between the first voltage VD1 and the second voltage VD2 reaches the preset value $COMP_{hys}$, the first comparator COMP1 can generate the refresh signal, the refresh signal can be served as the second trigger signal CT2 for waking up the low-voltage detection circuit 30, and also be served as the clock signal CLK to refresh the capacitor to sample the clock signal CLK, so as to maintain the voltage of the capacitor.

Please refer to FIG. 2. In other embodiment, the first switch M1 and the third switch M3 can be designed to have different transistor sizes, to make the third switch M3 significantly larger than the first switch M1. For example, the transistor size of the third switch M3 can be 5 times to 15 times of that of the first switch M1. Preferably, a ratio of the transistor sizes of the first switch M1 and the third switch M3 can be 1:10. Therefore, the current leakage rate of the first capacitor C1 through the first switch M1 can be lower than at of the third capacitor C3 through the third switch M3, so when the same current leakages occur on the first capacitor C1 and the third capacitor C3, the change in the second voltage VD2 on second node N2 can be higher.

Figure 4:
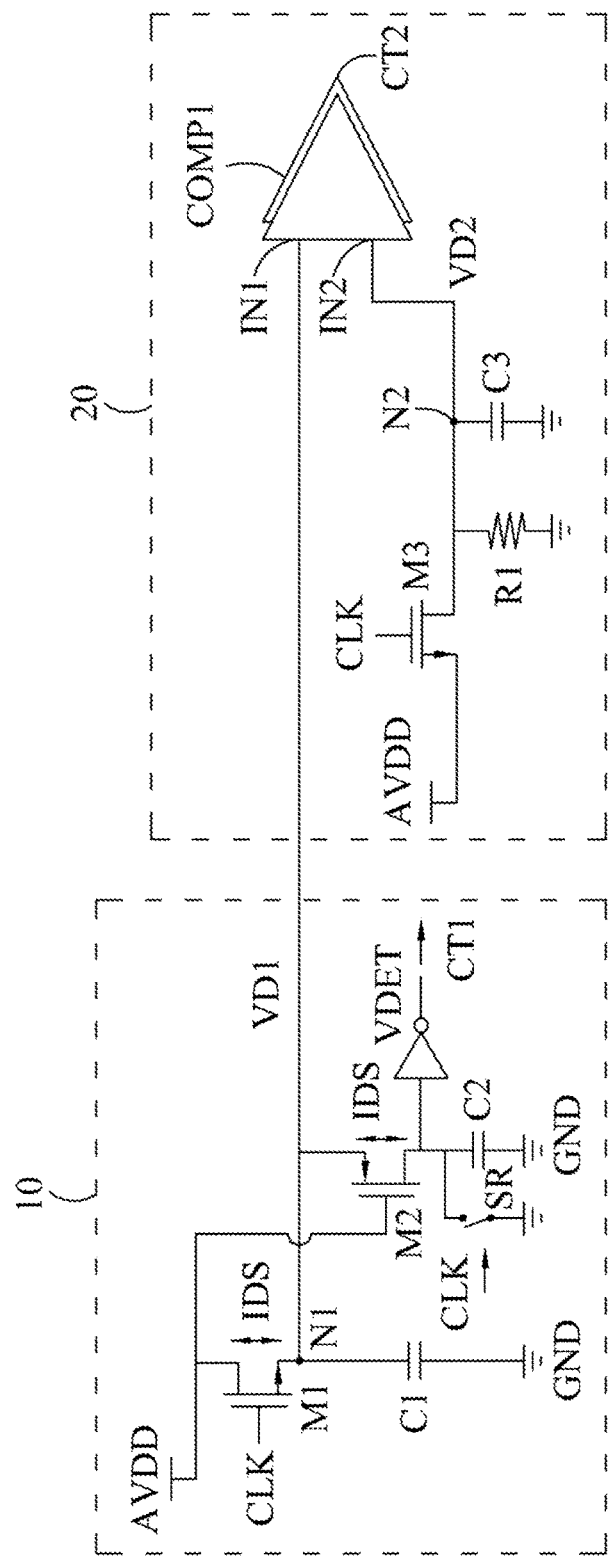
FIG. 4 is a circuit diagram of a threshold voltage detection circuit and a current leakage compensation circuit of another embodiment of the present invention.

Please refer to FIG. 4, which is a circuit diagram of a threshold voltage detection circuit and a current leakage compensation circuit of an embodiment of the present invention. The threshold voltage detection circuit 10 comprises the first switch M1, the second switch M2, the first capacitor C1, the invertor VDET and the reset switch SR. The current leakage compensation circuit 20 can comprise the third switch M3, the third capacitor C3, a first resistor R1 and the first comparator COMP1. The reference number of this embodiment equal to that of embodiment of FIG. 2 indicates to the same or similar component, so the detailed illustration of this component is not repeated. The difference between previous embodiment and this embodiment is that this embodiment comprises the first resistor R1 to simulate the current leakage path of the second switch M2. The first resistor R1 is disposed between the third switch M3 and the third capacitor C3, and the terminal of the first resistor R1 is electrically connected to the drain of the third switch M3 and the second node N2, and served as the current leakage path of the current leakage compensation circuit 20. The resistance of the first resistor R1 can be lower than that of the second switch M2, for example, the resistance of the second switch M2 can be 5 times to 15 times of resistance of the first resistor R1, and preferably, a ratio of resistances of the first resistor R1 to the second switch M2 can be 10:1. Similar to the different capacitances of the capacitors or different sizes of the transistors of the switches, the current leakage path of this embodiment is also used to change the current leakage rate of the current leakage compensation circuit 20. When the first resistor R1 has a lower resistance, current can leak through the current leakage path more easily, so that the second voltage VD2 on the second node N2 may have higher voltage drop, and when the difference between the first voltage VD1 and the second voltage VD2 reaches the preset voltage, the occurrence of current leakage is detected, thereby waking up the low-voltage detection circuit 30.

Furthermore, in the voltage detection circuit of the present invention, the threshold voltage detection circuit 10 can be in cooperation with the current leakage compensation circuit 20, the second trigger signal CT2 generated by the first comparator COMP1 can be used as the clock signal CLK corresponding to the sampling time, so that the voltage detection circuit does not have energy consumption of the oscillator. The manner of using the current leakage compensation circuit 20 to detect the current leakage for generating the trigger signal is also different from conventional manner of using the clock signal with fixed frequency. Specifically, in conventional manner, the oscillator is used to generate the clock signal with fixed frequency to control the switch of the voltage detection circuit, for example, the switch is turned on every 0.125 second to refresh the capacitor; however, the voltage drop caused by current leakage, temperature or process variation may vary greatly, so the conventional manner may turn on the switch for sampling overly frequently, thereby causing undesired energy waste. In the other hand, in this embodiment, the threshold voltage detection circuit 10 is in cooperation with the current leakage compensation circuit 20 to generate the sampling signal with flexible frequency, for example, the sampling frequency may be 1 Hz in environment with room temperature of 25° C. In environment with higher temperature, such as 125° C., the current leakage rate becomes higher, so the refresh frequency is also increased to 5 Hz; and, in environment with lower temperature, such as −40° C., the refresh frequency is also decreased to 0.3 Hz. As a result, the operation of the present invention can wake up the voltage detection circuit for detection by a most efficient and power-saving manner, so that the voltage detection circuit of the present invention can have the lowest power consumption.

Figure 5:
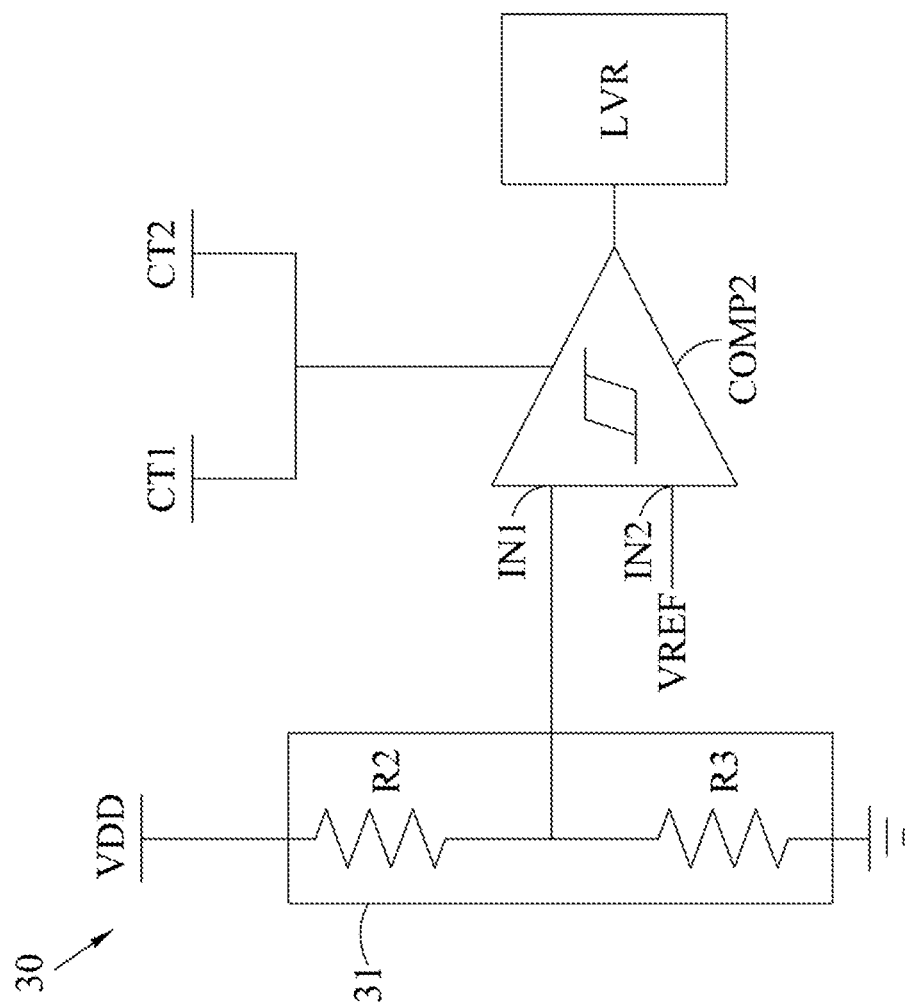
FIG. 5 is a circuit diagram of a low-voltage detection circuit of an embodiment of the present invention.

Please refer to FIG. 5, which is a circuit diagram of a low-voltage detection circuit of an embodiment of the present invention. A low-voltage detection circuit 30 comprises a voltage divider 31 and a second comparator COMP2. The voltage divider 31 can comprise a second resistance R2 and a third resistance R3. The voltage VDD of the power source S is divided and the divided voltage is inputted to the second comparator COMP2 through the first input terminal IN1. The second input terminal IN2 of the second comparator COMP2 is configured to receive the reference voltage VREF. The second comparator COMP2 can be activated by the first trigger signal CT1 transmitted from the threshold voltage detection circuit 10 or the second trigger signal CT2 transmitted from the current leakage compensation circuit 20. After the second comparator COMP2 is activated upon receipt of the first trigger signal CT1 or the second trigger signal CT2, the voltage divider 31 samples a voltage division of the voltage VDD of the power source S, and the second comparator COMP2 compares the divided voltage of the voltage VDD with the reference voltage VREF. When the divided voltage is lower than the reference voltage VREF, the second comparator COMP2 outputs the control signal to refresh the power source S to adjust the voltage VDD into the original set range. Alternatively, the second comparator COMP2 can be electrically connected to a low-voltage reset circuit LVR, and the low-voltage reset circuit LVR can be triggered by the control signal to generate the reset signal, so as to restart the electronic device or the power source S, to recover the system to the initial operation voltage.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A voltage detection circuit, electrically connected to a power source and comprising:
   a threshold voltage detection circuit, comprising:
      a first switch comprising a drain connected to the power source, and a gate configured to receive a clock signal and trigger the first switch to turn on in a sampling cycle;
      a first capacitor disposed between the first switch and a first ground terminal, wherein the first capacitor is charged to a first voltage;
      a second switch comprising a source electrically connected between a source of the first switch and the first capacitor, and a gate connected to the power source, wherein when a voltage of the power source received by the second switch is lower than the first voltage by a threshold voltage, the second switch is turned on to transmit a first trigger signal; and
      a second capacitor disposed between the second switch and a second ground terminal;
   a current leakage compensation circuit comprising a current leakage rate higher than a current leakage rate of the threshold voltage detection circuit, and comprising:
      a third switch comprising a source connected to the power source, and a gate configured to receive the clock signal and trigger the third switch to turn on in the sampling cycle;
      a third capacitor disposed between the third switch and a third ground terminal, wherein the third capacitor is charged to a second voltage; and
      a first comparator comprising a first input terminal electrically connected between the source of the first switch and the first capacitor, and a second input terminal electrically connected between a drain of the third switch and the third capacitor, wherein when a difference between the first voltage inputted from the first input terminal and a second voltage inputted from the second input terminal exceeds a preset value, the first comparator outputs the clock signal and the second trigger signal; and
   a low-voltage detection circuit electrically connected to the threshold voltage detection circuit and the current leakage compensation circuit, and configured to receive the first trigger signal or the second trigger signal, and detect whether a voltage of the power source is lower than a reference voltage.

2. The voltage detection circuit according to claim 1, wherein a capacitance of the first capacitor is higher than a capacitance of the third capacitor.

3. The voltage detection circuit according to claim 2, wherein a ratio of the capacitances of the first capacitor to the third capacitor is 10:1.

4. The voltage detection circuit according to claim 1, wherein a transistor size of the first switch is lower than a transistor size of the third switch.

5. The voltage detection circuit according to claim 4, wherein a ratio of the transistor sizes of the first switch to the third switch is 1:10.

6. The voltage detection circuit according to claim 1, wherein the current leakage compensation circuit comprises a current leakage path formed between the third switch and the third capacitor.

7. The voltage detection circuit according to claim 6, wherein the current leakage path comprises a fourth switch disposed between the third switch and the third capacitor.

8. The voltage detection circuit according to claim 1, wherein the low-voltage detection circuit comprises a voltage divider and a second comparator, and the voltage divider is electrically connected to the power source, and the second comparator is activated by the first trigger signal or the second trigger signal and configured to compare an input voltage inputted from the voltage divider and the reference voltage, and when the input voltage is lower than the reference voltage, the second comparator generates a reset signal.

9. The voltage detection circuit according to claim 1, wherein a current leakage rate of the first capacitor through the first switch is lower than a current leakage rate of the third capacitor through the third switch.

10. The voltage detection circuit according to claim 1, wherein the threshold voltage detection circuit comprises a reset switch electrically connected to the second capacitor in parallel.

* * * * *